US005233661A

United States Patent [19]

[11] Patent Number: 5,233,661
[45] Date of Patent: Aug. 3, 1993

Kawamura et al.

[54] SOUND FIELD VARIABLE APPARATUS

[75] Inventors: Akihisa Kawamura; Mitsuhiko Serikawa, both of Hirakata; Masaharu Matsumoto, Katano; Hiroko Numazu, Kadoma; Katsuaki Sato, Osaka, all of Japan

[73] Assignee: Matsushita Electric Industry Co., Ltd., Osaka, Japan

[21] Appl. No.: 687,695

[22] Filed: Apr. 19, 1991

[30] Foreign Application Priority Data

Apr. 19, 1990 [JP] Japan .................................. 2-103475

[51] Int. Cl.[5] .............................................. H03G 3/00

[52] U.S. Cl. ....................................... 381/61; 381/63; 381/77; 381/83; 381/93

[58] Field of Search ....................... 381/77, 82, 83, 93, 381/63, 61

[56] References Cited

U.S. PATENT DOCUMENTS 4,061,876 12/1977 Jaffe ..................................... 381/63
4,593,404 6/1986 Bolin ..................................... 381/82
4,783,818 11/1988 Graupe et al. ......................... 381/93
5,025,472 6/1991 Shimizu et al. ........................ 381/83

*Primary Examiner*—Jin F. Ng
*Assistant Examiner*—Edward Lefkowitz
*Attorney, Agent, or Firm*—Wenderoth, Lind & Ponack

[57] ABSTRACT

A sound field is generated responsive to direct sound picked up by a direct-sound collecting microphone and indirect-sound picked up by an indirect-sound collecting microphone. Respective processing circuits are provided for signal processing the sound signals of the direct-sound collecting microphone and the indirect-sound collecting microphone. An adaptive filter is provided having a transfer function equal to a transfer function from a reproducing speaker to the indirect-sound collecting microphone. The output of the signal processing circuit associated with the indirect-sound collecting microphone is filtered by the adaptive filter, and the output of the adaptive filter is subtracted from the output of the indirect-sound collecting microphone. The output of the subtractor is then applied to the signal processing circuit associated with the indirect-sound collecting microphone for signal processing. The transfer function is initially set in the adaptive filter by applying an output of a signal generator thereto.

5 Claims, 7 Drawing Sheets

SOUND FIELD VARIABLE APPARATUS

BACKGROUND

1. Field of the Invention

This invention relates to a sound field variable apparatus by which a musical or dramatic performance played in a concert hall or the like can be reproduced as a sound field in accordance with the characteristics of the performance.

2. Description of the Prior Art

Recently, the reproduction of a real sound field has become increasingly important, and sound field variable apparatus capable of simulating a sound field of a performance hall or the like have been developed. With the conventional sound field variable apparatus, a sound generated in a performance hall is picked up by a microphone and subjected to a suitable signal processing to thereby produce a sound signal capable of providing a sound field. Thus, a sound field capable of fulfilling the purpose of a performance can be reproduced.

FIG. 7 is a block diagram of a sound field variable apparatus according to the prior art which includes a microphone 16, a signal processing circuit 17 for effecting convolution or reverberation of a collected sound signal, an amplifier 9 for amplifying an output signal from the signal processing circuit 17, and a reproducing speaker 18 for reproducing the signal thus amplified.

With the sound field variable apparatus structured as above, if the microphone 16 is set near a performer and picks up a direct sound, and if the reverberation is to be added, the reverberation sound is determined based on the reverberation quality of the signal processing circuit 17. As a result, the reverberation sound cannot always meet the hall conditions or requirements, thus being unable to provide a natural reproduced sound.

In addition, if the microphone 16 is set in the hall away from the performer, it becomes positioned close to a sound field reproducing speaker, thus increasing the probability that howling will be generated, and resulting in a situation in which the sound field cannot be added as desired.

SUMMARY OF THE INVENTION

An object of this invention is to provide a sound field variable apparatus capable of reproducing a sound field in accordance with a purpose of a performance while maintaining hall peculiarities under a howling preventive condition.

In order to attain the above-mentioned object, a sound field variable apparatus of this invention comprises a direct-sound collecting microphone, an indirect-sound collecting microphone, a signal processing circuit for effecting a sound field addition, a direct-sound reproducing speaker, an indirect-sound reproducing speaker, an adaptive filter for obtaining a transfer function between the indirect-sound collecting microphone and the indirect-sound reproducing speaker, a subtractor for subtracting the transfer function from an output signal from the indirect-sound collecting microphone, a signal generator for generating a signal used for measuring a transfer function to be set in the adaptive filter, and a control circuit for effecting measurement and setting of the transfer function.

With the above-mentioned structure, a transfer function between the indirect-sound collecting microphone set at a desired position and the indirect-sound reproducing speaker is measured, and the transfer function thus measured is set to the adaptive filter, so that an echo caused by the acoustic combination between the indirect-sound reproducing speaker can be canceled, thus making it possible to prevent howling from taking place. By varying the sound volume balance of direct sound and indirect sound speakers in accordance with the purpose or characteristics of a performance to be held, the sound field can be reproduced naturally and responsively.

DESCRIPTION OF THE PREFERRED EMBODIMENT

Figure 1:
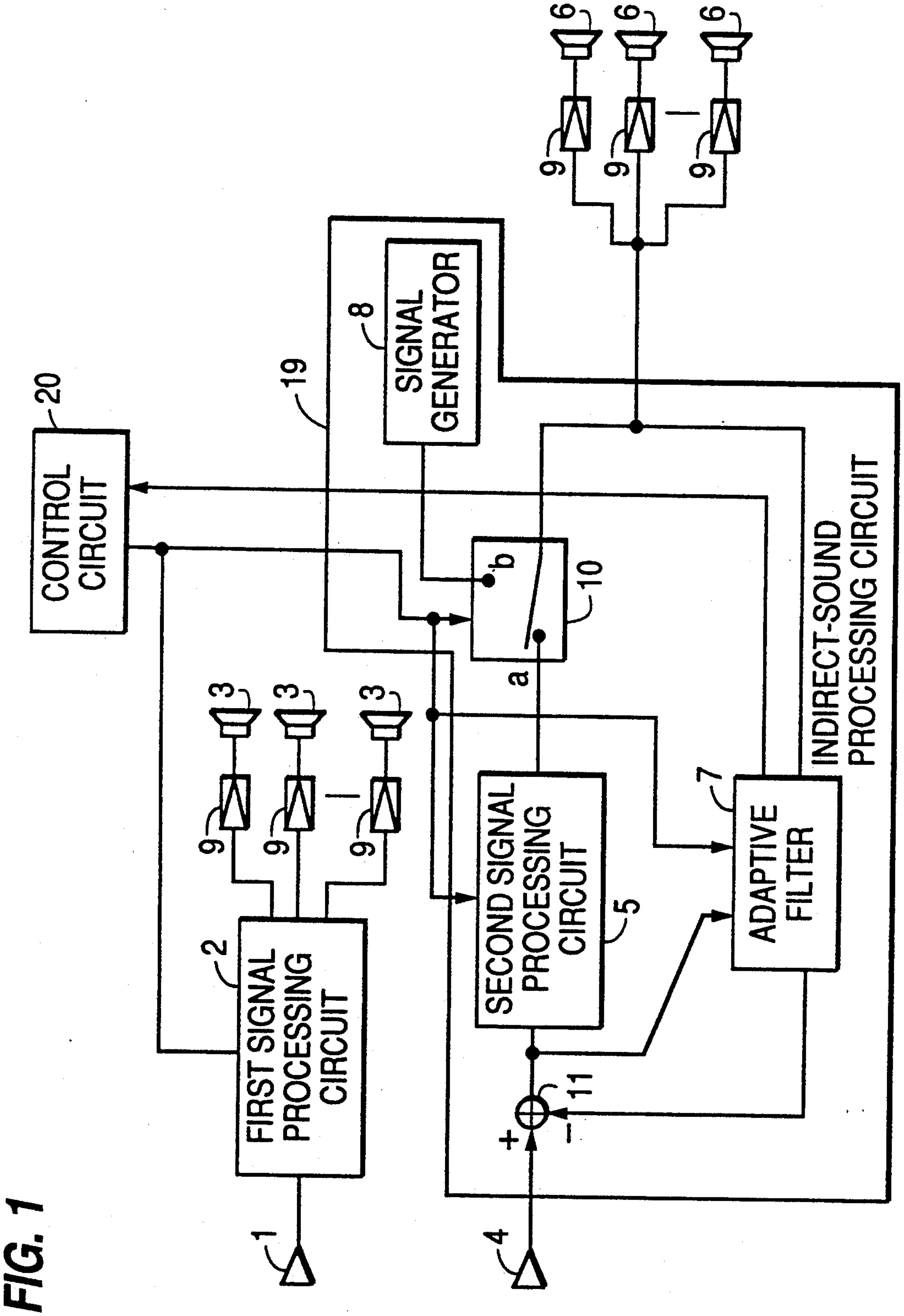
FIG. 1 is a block diagram of a sound field variable apparatus according to a first embodiment of this invention.

FIG. 1 is a block diagram of a sound field variable apparatus according to a first embodiment of this invention.

As shown in FIG. 1, the sound field variable apparatus of the first embodiments includes a direct-sound collecting microphone 1 for picking up a direct sound; a first signal processing circuit 2 for creating a sound field signal by effecting signal processing such as, for example, convolution or reverberation operations on the direct sound picked up by the microphone 1; direct-sound reproducing speakers 3 for effecting a reproduction of the sound field signal generated by the first signal processing circuit 2; an indirect-sound collecting microphone 4 for picking up a sound including a reflected sound from a desired position; a second signal processing circuit 5 for creating a sound field signal by effecting signal processing as processed by the first signal processing circuit 2 on the indirect sound picked up by the microphone 4; indirect-sound reproducing speakers 6 for reproducing the sound field signal generated by the second signal processing circuit 5; an adaptive filter 7 for realizing a transfer function equal to the transfer function between the indirect-sound collecting microphone 4 and the indirect-sound reproducing speakers 6; a subtractor 11 for subtracting an output signal of the adaptive filter 7 from a sound signal generated by the indirect-sound collecting microphone 4; a signal generator 8 for generating a signal for measuring a transfer function between the indirect-sound collecting microphone 4 and the indirect-sound reproducing speakers 6; amplifiers 9 for amplifying output signals from the first signal processing circuit 2 and second signal processing circuit 5; a switch 10 for switching between a normal sound signal outputted from the second signal processing circuit 5 and the signal for measuring the transfer function outputted from the signal generator 8; and a control circuit 20 for setting a measured transfer function into the adaptive filter 7 and for controlling the switch 10. An indirect-sound processing circuit 19 is made up of the second signal processing circuit 5, adaptive filter 7, subtractor 11, signal generator 8 and switch 10.

The operation of the sound field variable apparatus as structured above will be explained below.

Figure 2:
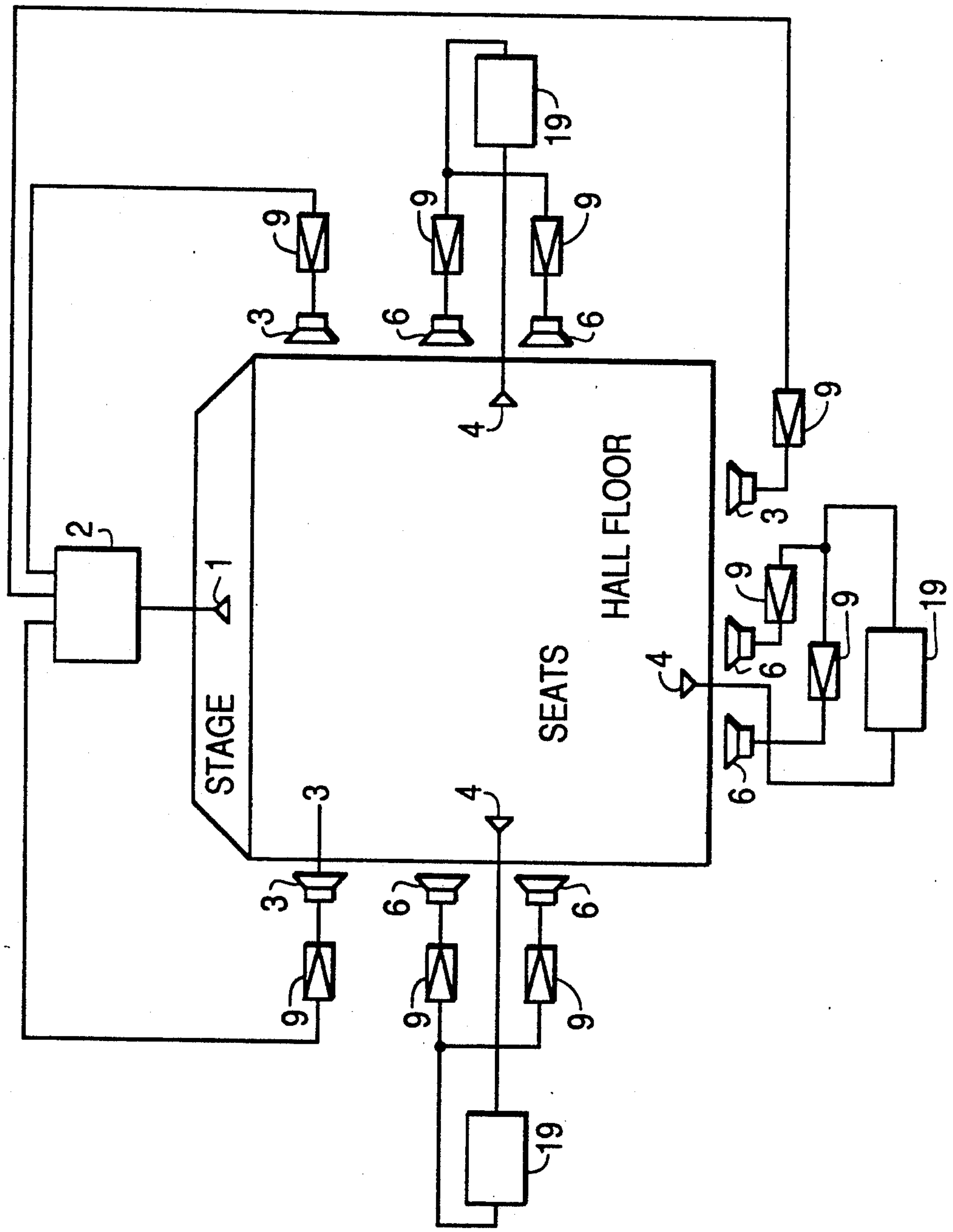
FIG. 2 is a diagram showing placement positions of microphones and speakers of the first embodiment.

FIG. 2 shows an arrangement within a hall of the microphones and speakers according to a first embodiment.

First, a transfer function to be set into the adaptive filter 7 is measured.

A method of performing this transfer function measurement is as follows. The switch 10 is turned to the "b" position shown in FIG. 1 by the control circuit 20 just before a performance begins on stage, and a Chirp signal or a signal having a good low-band S/N ratio such as pink noise is generated from the signal generator 8 to be reproduced from the indirect-sound reproducing speakers 6. Thus, reproduced sound is collected via the indirect-sound collecting microphones 4. By using, for example, the LMS method or the learning identification method and by varying the transfer function set in the adaptive filter 7 to minimize the error signal from the subtractor 11, the control circuit 20 determines a transfer function between the indirect-sound collecting microphone 4 and the indirect-sound reproducing speakers 6. In this embodiment, an FIR filter is used as the adaptive filter 7.

The determined transfer function is set by the control circuit 20 into the adaptive filter 7. The adaptive filter 7 convolutes the transfer function thus set and an input signal to thereby create a signal substantially identical to a signal to be collected from the indirect-sound reproducing speakers 6 into the indirect-sound collecting microphone 4.

Next, the switch 10 is turned to the "a" position by the control circuit 20 to shift the operation to a normal mode.

Sound produced by a performance on the stage is picked-up through the direct-sound collecting microphone 1, and then subjected to the convolution or reverberation operation through the first signal processing circuit 2, thereby realizing a desired sound field. The signal thus processed is reproduced from a plurality of direct-sound reproducing speakers 3 arranged in the hall in a suitably spaced relation to each other. In addition, the sound in the hall is picked-up through a plurality of indirect-sound collecting microphones 4 arranged in the hall in a suitable spaced relation to each other. In this case, a generated echo component caused by the acoustic combination between the indirect-sound collecting microphone 4 and indirect-sound reproducing speakers 6, which is formed by the adaptive filter 7, is subtracted through the subtractor 11 from the sound picked-up through the microphones 4. Then, the sound signal thus subtracted is subjected to signal processings for effecting reverberation addition or the like and then reproduced through the indirect-sound reproducing speakers 6.

A small distance is provided between the indirect-sound collecting microphone 4 and the associated indirect-sound reproducing speakers 6 to minimize the effects on the transfer function of temperature, humidity and sound collectability of a hall and the effects of audience movements.

The volume of each of the direct-sound reproducing speakers 3 and the indirect-sound reproducing speakers 6 varies depending on the purpose of a performance to be held and the sound field to be realized. For example, in the case where it is necessary to provide a reverberation effect such as in the playing of a pipe organ, the sound volume of the indirect-sound reproducing speaker 6 is made proportionally large, and on the other hand, in the case where it is necessary to provide a relatively clear sound such as in the playing of a drama, the sound reproduction is effected mostly by the direct-sound reproducing speaker 3.

As explained above, signal processing circuits for signal-processing each direct sound and indirect sound are provided, an adaptive filter is introduced into an indirect-sound processing circuit, and an echo component caused by the acoustic combination between an indirect-sound reproducing speaker and an indirect-sound collecting microphone is subtracted from the indirect-sound, so that the sound field can be controlled while maintaining a condition in which it is difficult for howling to take place. In addition, by varying the relative sound volume of the direct-sound reproducing speakers and indirect-sound reproducing speakers, a natural sound field reproduction in accordance with the characteristics of a performance to be held can be realized.

A second embodiment of this invention will be described below by referring to FIG. 3.

Figure 3:
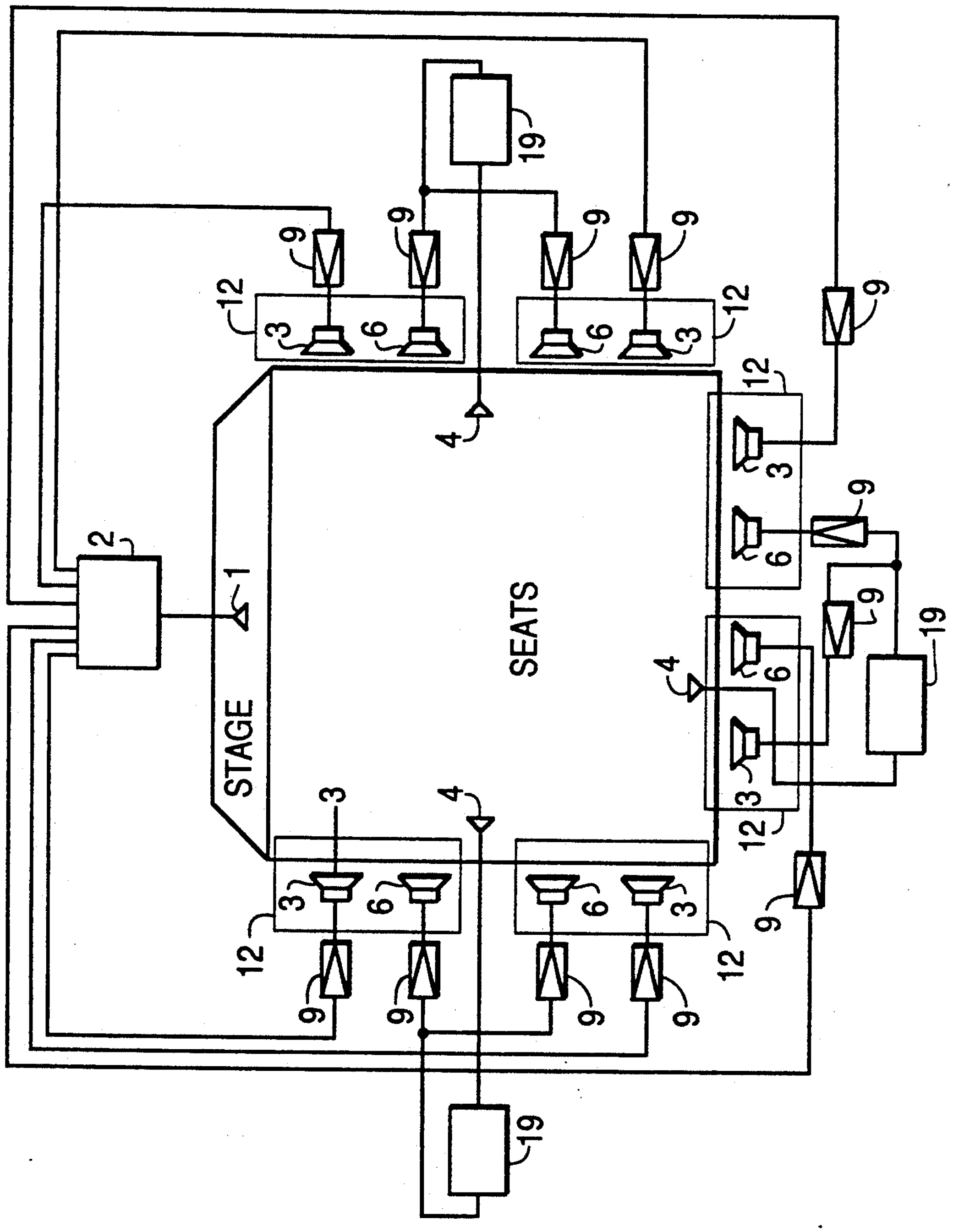
FIG. 3 is a diagram showing placement positions of microphones and speakers of a second embodiment.

FIG. 3 shows an arrangement within a hall of microphones and speakers according to this embodiment.

In FIG. 3, the reference numeral 12 denotes a set of reproducing speakers including as a pair a direct-sound reproducing speaker 3 and an indirect-sound reproducing speaker 6. Otherwise, the remaining components are the same as those in the first embodiment and are respectively indicated by the same reference numerals as used in the first embodiment.

The normal operation of the second embodiment is similar to that of the first embodiment. Signals processed through a first signal processing circuit 2 and a second signal processing circuit of an indirect-sound processing circuit 19 (i.e. second signal processing circuit 5 shown in FIG. 1) are reproduced through the reproducing speakers 12 each consisting as a pair a direct-sound reproducing speaker 3 and an indirect-sound reproducing speaker 6 and arranged in the hall in a suitably spaced relation to each other.

Thus, direct sound and indirect sound optionally subjected to the signal processing as described above are reproduced from the reproducing speakers 12 arranged in a comparatively close relation to each other to thereby be added spatially, thus being capable of effecting reproduction of a sound field having a natural feeling.

Next, a third embodiment of this invention will be described below by referring to FIG. 4.

Figure 4:
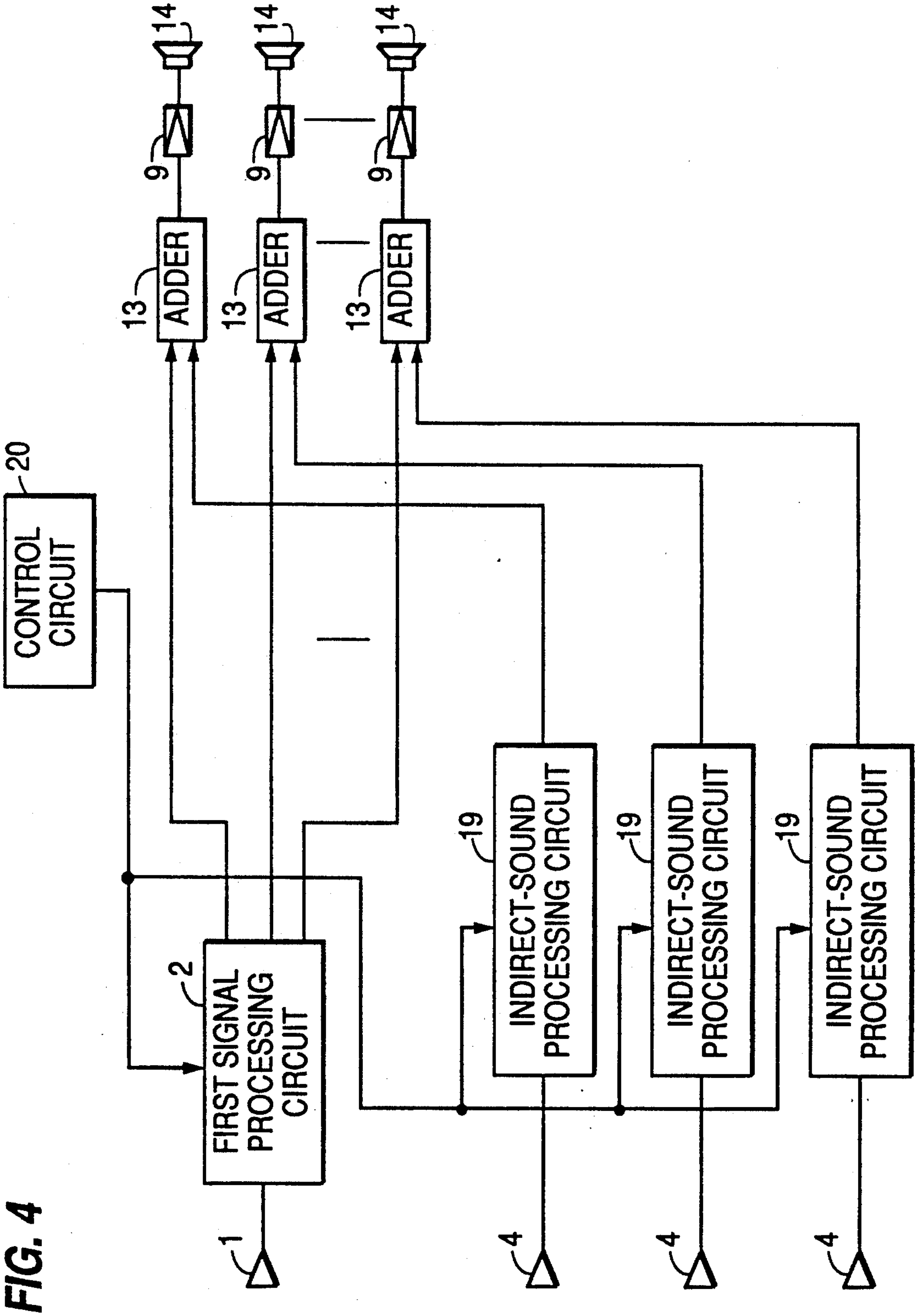
FIG. 4 is a block diagram of a sound field variable apparatus according to a third embodiment of this invention.

FIG. 4 is a block diagram of a sound field variable apparatus according to this embodiment.

In FIG. 4, the reference numeral 13 denotes adders each for adding an output signal from a first signal processing circuit 2 and an output signal form a second signal processing circuit of an indirect-sound processing circuit 19 (i.e. second signal processing circuit 5 shown in FIG. 1), and the reference numeral 14 denotes reproducing speakers. Otherwise, the remaining components are the same as those in the first embodiment and are respectively indicated by the same reference numerals as used in the first embodiment.

Figure 5:
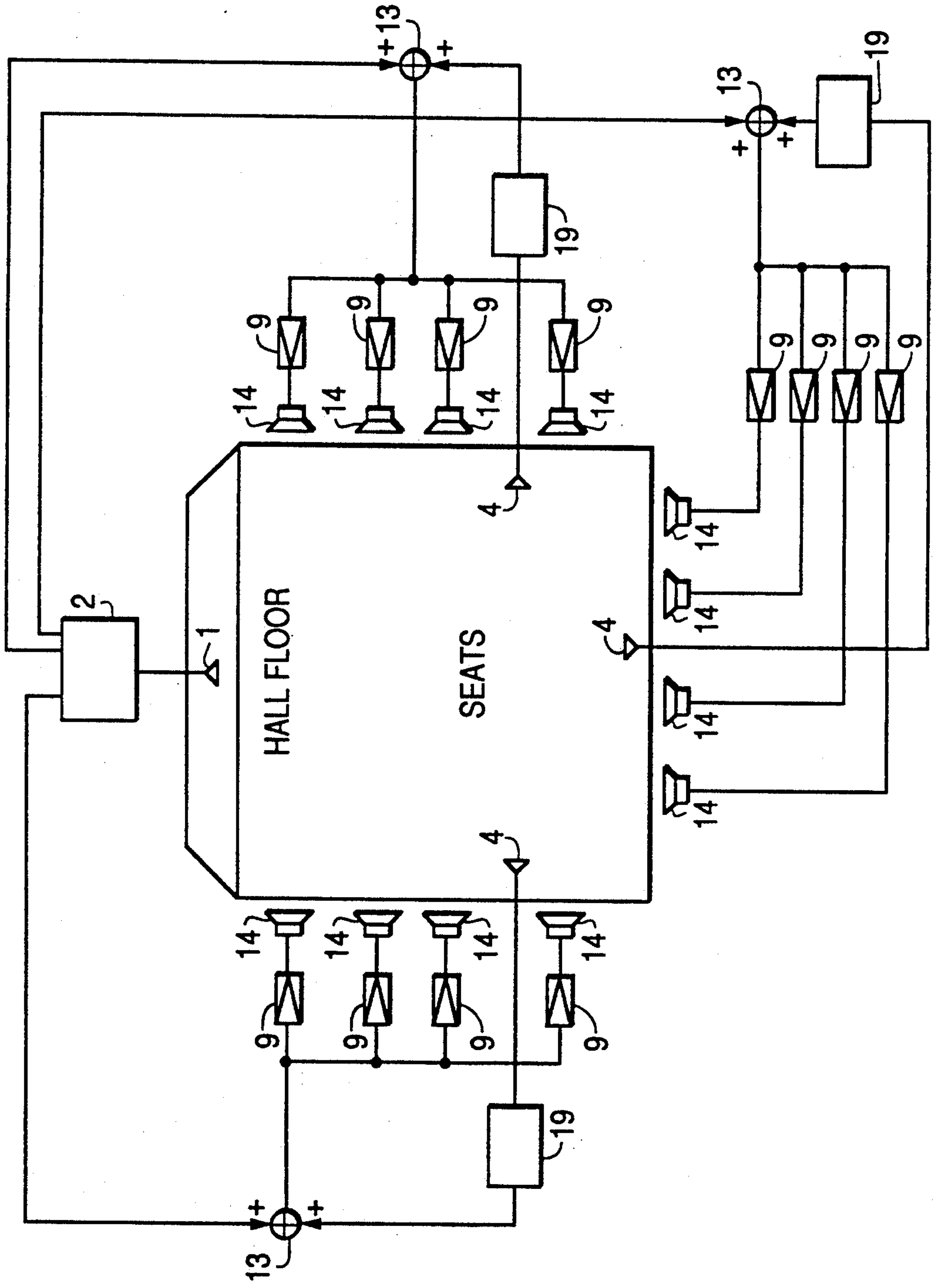
FIG. 5 is a diagram showing placement positions of microphones and speakers of the third embodiment.

FIG. 5 shows an arrangement within a hall of microphones and speakers according to this embodiment.

As shown in FIG. 4 and FIG. 5, a signal processed through the first signal processing circuit 2 and a signal processed through the second signal processing circuit of an indirect-sound processing circuit 19 (i.e. second signal processing circuit 5 shown in FIG. 1) are added by the adder 13 and reproduced from reproducing speakers 14 arranged at suitably spaced intervals within the hall.

The optionally signal-processed direct sound and indirect sound are electrically added to each other as shown above. As a result, it is not necessary to provide separate speakers for each of the direct sound and indirect sound, and it is possible to reproduce a natural sound field.

Next, a fourth embodiment of this invention will be described below while referring to FIG. 6.

Figure 6:
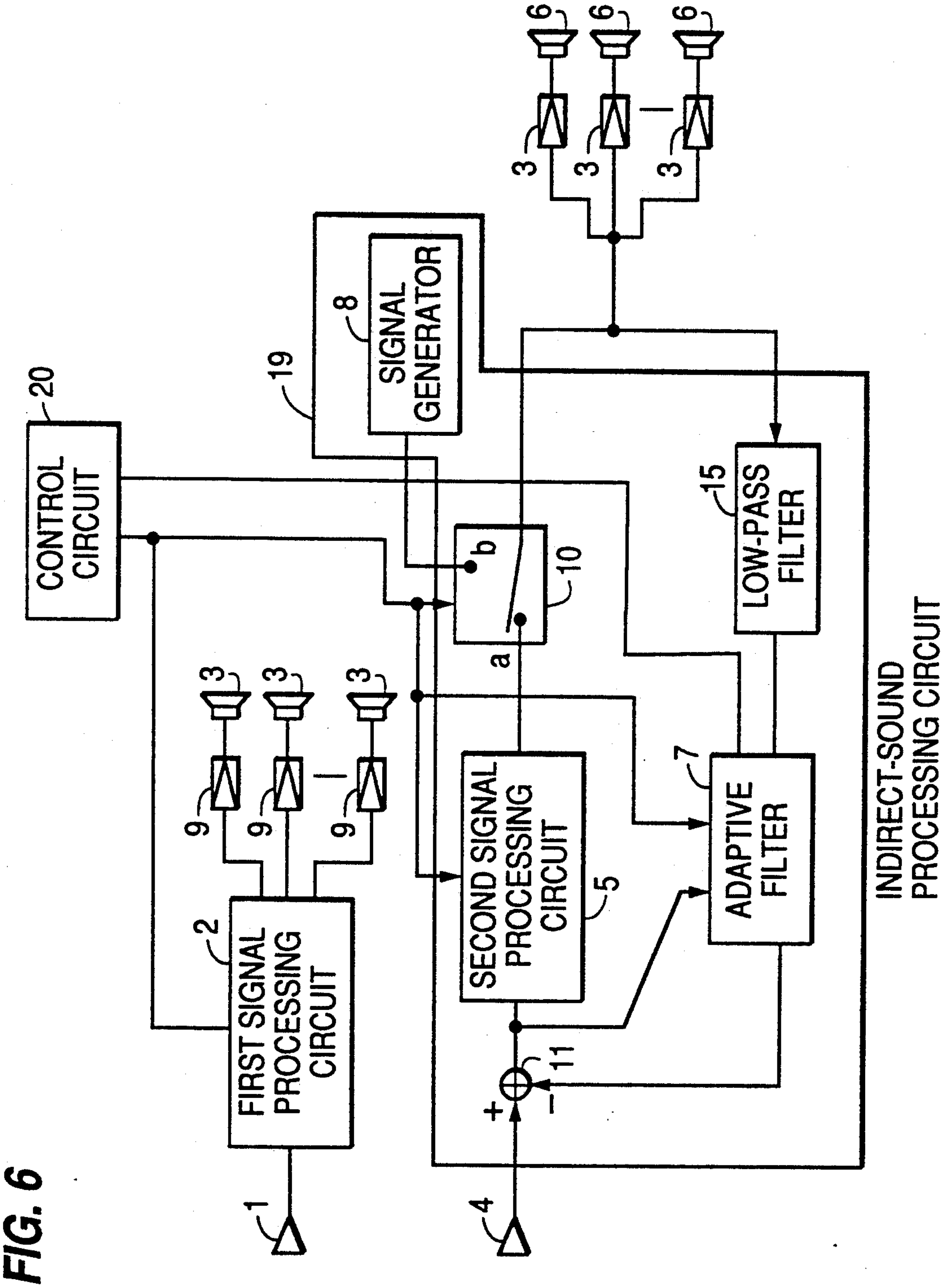
FIG. 6 is a block diagram of a sound field variable apparatus according to a fourth embodiment of this invention.
Figure 7:
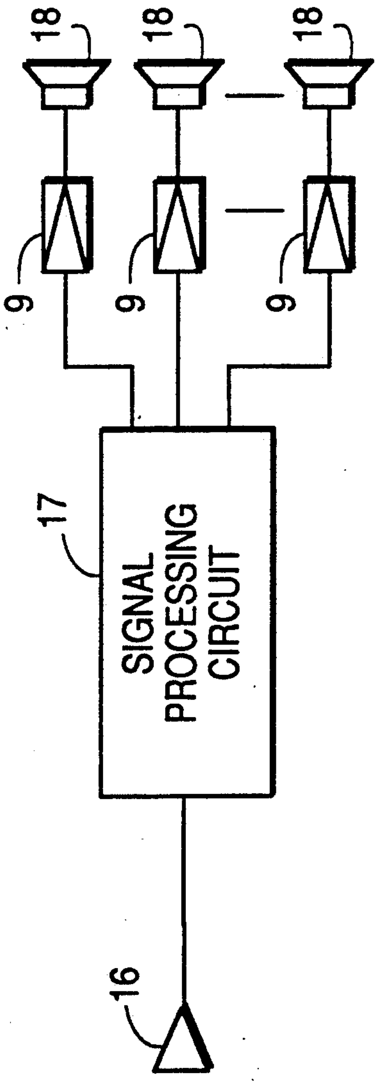
FIG. 7 PRIOR ART
FIG. 7 is a block diagram of a sound field variable apparatus according to the prior art.

FIG. 6 is a block diagram of a sound field variable apparatus according to this embodiment.

In FIG. 6, the reference numeral 15 denotes a low-pass filter for effecting a band limitation. Otherwise, the remaining components are the same as those in the first embodiment and are respectively indicated by the same reference numerals as used in the first embodiment.

In the apparatus of FIG. 6, only a low-band component extracted from a sound collected through an indirect-sound collecting microphone 4 by the low-pass filter 15 is filtered by the adaptive filter 7, subtracted through a subtractor 11 by an echo component generated through the adaptive filter 7 caused by the acoustic combination between the indirect-sound collecting microphone 4 and indirect-sound reproducing speakers 6, and then subjected to the signal processing through the second signal processing circuit 5 and reproduced from the indirect-sound reproducing speakers 6. In a large space such as, for example, a performance hall, a high-band component is large in attenuation, howling is apt to be generated at a comparatively low-band component, and even the howling cancel processing of the low-band component makes it possible to provide a large howling control effect. In addition, as a low-band component is comparatively small in variation of transfer function, the difference from a transfer function pre-set into the adaptive filter 7, so that it is always possible to achieve a largely effective howling control.

The cut-off frequency of the low-pass filter may be selected at about 2 KHz. In addition, since only a low-band component is processed, the sampling rate becomes 4 KHz, which means that the sampling rate in this embodiment is one-tenth of that employed when a frequency band of 20 KHz is reproduced. As a result, at the same tap number of a FIR filter constituting the adaptive filter 7, a transfer function decouple in time can be realized.

Further, as described above, only one direct-sound collecting microphone 1 is employed. However, the same effects can be obtained in the case where a plurality of direct-sound collecting microphones are employed.

Still further, the number of positions where the indirect-sound collecting microphones 4 and the indirect-sound speakers 6 are arranged can be increased depending on the size of the space to be reproduced.

What is claimed is:

1. A sound field variable apparatus comprising:

a direct-sound collecting microphone for picking up a direct sound to obtain a direct sound signal;

a first signal processing circuit for processing the direct sound signal picked up by said direct-sound collecting microphone;

an indirect-sound collecting microphone for picking up an indirect sound to obtain an indirect sound signal;

a second signal processing circuit for processing the indirect sound signal picked up by said indirect-sound collecting microphone;

a speaker means for reproducing sound from output signals of said first and second signal processing circuits;

an adaptive filter for setting therein a transfer function equal to a transfer function from said speaker means to said indirect-sound collecting microphone and for filtering the output signal of said second signal processing circuit;

a subtractor provided between said indirect-sound collecting microphone and said second signal processing circuit for subtracting an output signal of said adaptive filter from the indirect sound signal picked up by said indirect-sound collecting microphone, an output signal of said subtractor being fed to said second signal processing circuit;

a signal generator for generating a specific signal usable for measuring the transfer function from said speaker means to said indirect-sound collecting microphone;

a switch means for selectively feeding either one of said specific signal and the output signal of said second signal processing circuit to both of said adaptive filter and said speaker means; and a control means for controlling said switch means so as to feed said specific signal to both of said adaptive filter and said speaker means while controlling said adpative filter so as to measure the transfer function from said speaker means to said indirect-sound collecting microphone from an output signal of said subtractor and set the measured transfer function in said adaptive filter, and thereafter controlling said switch means so as to feed the output signal of said second signal processing circuit to both of said filter and said speaker means.

2. An apparatus according to claim 1, wherein said speaker means comprises at least one direct-sound reproducing speaker coupled to said first signal processing circuit for reproducing direct sound from the output signal of said first signal processing circuit, and at least one indirect-sound reproducing speaker coupled to said second signal processing circuit for reproducing indirect sound from the output signal of said second signal processing circuit.

3. An apparatus according to claim 1, wherein said speaker means comprises at least one pair of a direct-sound reproducing speaker coupled to said first signal processing circuit for reproducing direct sound from the output signal of said first signal processing circuit and an indirect-sound reproducing speaker coupled to said second signal processing circuit for reproducing indirect sound from the output signal of said second signal processing circuit, said pair of direct-sound and indirect-sound reproducing speakers being arranged in close proximity to each other.

4. An apparatus according to claim 1, further comprising an adder for adding the output signal of said first signal processing circuit and the output signal of said second signal processing circuit, an output signal of said adder being fed to said speaker means to reproduce sound.

5. An apparatus according to claim 1, further comprising a low-pass filter provided between said switch means and said adaptive filter for extracting only a low-frequency band component from an output signal of said switch means, the extracted low-frequency band component being filtered by said adaptive filter.

* * * * *